(12) United States Patent
Wu et al.

(10) Patent No.: US 10,303,124 B2
(45) Date of Patent: *May 28, 2019

(54) TIME-TO-DIGITAL CONVERTER

(71) Applicant: Huawei Technologies Co., Ltd., Shenzhen (CN)

(72) Inventors: Ying Wu, Delft (NL); Robert Bogdan Staszewski, Delft (NL); Yihong Mao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/985,252

(22) Filed: May 21, 2018

(65) Prior Publication Data

US 2018/0267482 A1 Sep. 20, 2018

Related U.S. Application Data

(60) Division of application No. 15/667,114, filed on Aug. 2, 2017, now Pat. No. 9,989,928, which is a continuation of application No. PCT/EP2015/052183, filed on Feb. 3, 2015.

(51) Int. Cl.
*H03M 3/00* (2006.01)
*G04F 3/00* (2006.01)
*G04F 10/00* (2006.01)

(52) U.S. Cl.
CPC .......... *G04F 10/005* (2013.01); *H03M 3/414* (2013.01)

(58) Field of Classification Search
CPC ......... G04F 10/005; H03M 1/50; H03M 1/60; H03M 3/02
USPC .................................................. 341/143, 166
See application file for complete search history.

(56) References Cited

U.S. PATENT DOCUMENTS

| 8,421,661 | B1 | 4/2013 | Jee et al. |
| 8,674,244 | B2* | 3/2014 | Kim ...................... G04F 10/005 |
| | | | 178/20.04 |
| 8,941,526 | B2 | 1/2015 | Dosho et al. |
| 9,989,928 | B2* | 6/2018 | Wu ........................ G04F 10/005 |

(Continued)

FOREIGN PATENT DOCUMENTS

| CN | 1455515 A | 11/2003 |
| CN | 101753142 A | 6/2010 |
| CN | 102811049 A | 12/2012 |

(Continued)

OTHER PUBLICATIONS

Levantino et al, "An Adaptive Pre-Distortion Technique to Mitigate the DTC Nonlinearity in Digital PLLs," IEEE Journal of Solid-State Circuits vol. 49, Issue: 8, Institute of Electrical and Electronics Engineers, New York, New York (Aug. 2014).

(Continued)

*Primary Examiner* — Khai M Nguyen
(74) *Attorney, Agent, or Firm* — Leydig, Voit & Mayer, Ltd.

(57) ABSTRACT

A time-to-digital converter includes: an input for receiving a time-domain input signal; an output for providing a digital output signal; a time register coupled to the input and to a first node; a time quantizer coupled to the time register for providing the digital output signal at the output; and a digital-to-time converter coupled to the output for providing a feed-back signal at the first node.

20 Claims, 7 Drawing Sheets

(56) References Cited

U.S. PATENT DOCUMENTS

2014/0086275 A1   3/2014   Kim et al.

FOREIGN PATENT DOCUMENTS

CN   103986461 A   8/2014
KR   101278111 B1   6/2013

OTHER PUBLICATIONS

Yuan "CMOS time-to-digital converters for mixed-mode signal processing," The Journal of Engineering, XP055233764, pp. 140-154, (2014).

Rahkonen et al., "The use of stabilized CMOS delay lines for the digitization of short time intervals," IEEE Journal of Solid-State Circuits, vol. 28, No. 8, Institute of Electrical and Electronics Engineers, New York, New York (Aug. 1993).

Chen et al., "A CMOS pulse-shrinking delay element for time interval measurement," IEEE Transactions on Circuits and Systems—II: Analog and Digital Signal Processing, vol. 47, No. 9, Institute of Electrical and Electronics Engineers, New York, New York (Sep. 2000).

Henzler et al, "90nm 4.7ps-Resolution 0.7-LSB Single-Shot Precision and 19pJ-per-Shot Local Passive Interpolation Time-to-Digital Converter with On-Chip Characterization," ISSCC 2008/ Session 30/ Data-Converter Techniques / 30.5, 2008 IEEE International Solid-State Circuits Conference, Institute of Electrical and Electronics Engineers, New York, New York (2008).

* cited by examiner

TIME-TO-DIGITAL CONVERTER

CROSS-REFERENCE TO RELATED APPLICATIONS

This application is a divisional application of U.S. patent application Ser. No. 15/667,114, filed on Aug. 2, 2017, which is a continuation of International Application No. PCT/EP2015/052183, filed on Feb. 3, 2015. All of the afore-mentioned patent applications are hereby incorporated by reference in their entireties.

TECHNICAL FIELD

The present disclosure relates to a time-to-digital converter for providing a digital output signal based on a time-domain input signal. The disclosure further relates to a high-order time-to-digital converter, in particular a high-order time-to-digital converter for providing a digital output signal as a digital representation of the time-domain input signal including a noise-shaped quantization error.

BACKGROUND

In general, a time to digital converter (TDC) is a device for recognizing events and providing a digital representation of the time they occurred. Time-to-digital converters or also called time digitizers are commonly used to measure a time interval and convert it into a digital output. TDCs are used in many different applications, where the time interval between two signal pulses shall be determined. Measurement is started and stopped, when either the rising or the falling edge of a signal pulse crosses a predefined threshold.

A lot of different types of TDCs currently exist. A Vernier TDC uses two delay lines, with respective inverter delay of t1 and t2. The effective time resolution is given by the delay difference t1−t2 (assuming t1>t2). Since time resolution is determined by a very small delay difference, a very large number of inverter stages is required to cover a large detection range which leads to delay mismatch and meanwhile increases power consumption. A pulse-shrinking TDC that utilizes the difference between the rise time and the fall time of e.g., an inverter, is severely affected by process-voltage-temperature (PVT) variations. A time-amplifying TDC amplifies the time residue from a coarse TDC, which is then resolved in a fine TDC, in the same fashion as a two-step A/D converter, with the same attending linearity issue (critically dependent on PVT variations). A passive phase-interpolating TDC uses passive devices to achieve a sub-gate-delay, but its precision is limited by parasitic capacitances on the output nodes between interpolating resistors. A gated-ring oscillator TDC (GRO TDC) has the noise-shaping characteristic. The quantization noise is shaped in frequency as in a first-order $\Delta\Sigma$ modulator, i.e., it is largely pushed towards higher frequencies. Since the GRO TDC operates in high frequency, i.e, several Giga Hz the power consumption is very high and the $1^{st}$ order noise-shaping limits its bandwidth.

There is a need to improve the accuracy of time to digital converters. In particular it is required to improve the time-to-digital converter (TDC) resolution to about 1 ps, which is an order-of-magnitude better than that provided by the delay of an inverter delay in a given process technology. This kind of TDC resolution is extremely challenging, but nowadays needed, in low-power mobile applications, such as all-digital PLL (ADPLL)-based cellular phones.

SUMMARY

It is the object of the disclosure to improve the time-to-digital converter accuracy, in particular to improve the time to digital converter resolution to about 1-2 ps.

This object is achieved by the features of the independent claims. Further implementation forms are apparent from the dependent claims, the description and the figures.

In order to describe the disclosure in detail, the following terms, abbreviations and notations will be used:

TDC: time-to-digital converter
DTC: digital-to-time converter
PLL: phase locked loop
ADPLL: all-digital PLL
PVT: process-voltage-temperature
GRO: gated ring oscillator
ADC: Analog-to-Digital Converter
DAC: Digital-to-Analog Converter According to a first aspect, the disclosure relates to a time-to-digital converter comprising: an input for receiving a time-domain input signal; an output for providing a digital output signal; a time register coupled to the input and to a first node; a time quantizer coupled to the time register for providing the digital output signal at the output; and a digital-to-time converter coupled to the output for providing a feed-back signal at the first node.

By using such feedback structure with time register, time quantizer and feedback signal path, the time-to-digital converter accuracy can be improved. In particular, a time to digital converter resolution of about 1-2 ps can be obtained. Such error-feedback based TDC utilizes the noise-shaping characteristic to push the quantization noise to high frequency. Thus, the in-band or low frequency noise is largely reduced.

In a first possible implementation form of the time-to-digital converter according to the first aspect, the digital output signal is an oversampled representation of the time-domain input signal.

By using oversampling, the accuracy of the noise-shaping can be improved. The noise can be shifted to regions where the noise is not harmful.

In a second possible implementation form of the time-to-digital converter according to the first aspect as such or according to the first implementation form of the first aspect, the feedback signal is a quantization error signal.

When the feedback signal is a quantization error signal, the quantization error can be controlled by using an adequate transfer function.

In a third possible implementation form of the time-to-digital converter according to the first aspect as such or according to any of the preceding implementation forms of the first aspect, the digital-to-time converter is coupled to the time register for delaying an output signal of the time register in response to the digital output signal.

When the digital-to-time converter is coupled to the time register the output signal of the time register can be delayed in response to the digital output signal, i.e. a synchronous operation of the time-to-digital converter can be achieved. The operation can be synchronized by a clock signal.

In a fourth possible implementation form of the time-to-digital converter according to the first aspect as such or according to any of the preceding implementation forms of the first aspect, the time register is configured to combine the time-domain input signal with the feedback signal to produce a modified time-domain input signal.

When the time register combines the time-domain input signal with the feedback signal a feedback loop can be implemented by the time register thereby facilitating noise shaping.

In a fifth possible implementation form of the time-to-digital converter according to the fourth implementation form of the first aspect, the combination is a subtraction.

When the combination is a subtraction the quantization error can be minimized thereby performing optimal noise shaping and improved accuracy of the time to digital conversion.

In a sixth possible implementation form of the time-to-digital converter according to the fourth or the fifth implementation form of the first aspect, the time register is configured to delay the modified time-domain input signal by at least one cycle of a sampling clock.

When the time register delays the modified time-domain input signal by one or more sampling clock cycles a transfer function of the TDC can be realized. Depending on the number of sampling clock cycles and a degree or order of the TDC the transfer function can be shaped with respect to some optimization criterion.

In a seventh possible implementation form of the time-to-digital converter according to the first aspect as such or according to any of the preceding implementation forms of the first aspect, the time-domain input signal comprises a pair of two input signals.

When the time-domain input signal comprises a pair of two input signals, these two input signals can be synchronously processed.

In an eighth possible implementation form of the time-to-digital converter according to the seventh implementation form of the first aspect, the two input signals comprise a first digital clock and a second digital clock.

When the two input signals are a first digital clock and a second digital clock, the TDC can synchronously process the two digital clock signals and provide an output signal depending on a relation between the two digital clock signals.

In a ninth possible implementation form of the time-to-digital converter according to the eighth implementation form of the first aspect, a value of the time-domain input signal corresponds to a time difference between a transition of the first digital clock and a transition of the second digital clock.

When a value of the time-domain input signal corresponds to a time difference between a transition of the first digital clock and a transition of the second digital clock the digital output signal can accurately reproduce the time difference between the two clock transitions in a digital form.

In a tenth possible implementation form of the time-to-digital converter according to the first aspect as such or according to any of the preceding implementation forms of the first aspect, the time quantizer is configured to produce 1.5 bits.

By having 1 bit two signal levels can be implemented. By having 2 bits four signal levels can be implemented. When the time quantizer produces 1.5 bits three different signal levels can be provided in a very computational efficient manner.

In an eleventh possible implementation form of the time-to-digital converter according to the first aspect as such or according to any of the preceding implementation forms of the first aspect, a resolution of the time quantizer is 1.5 bits.

When the resolution of the time quantizer is 1.5 bits three signal levels can be implemented. By having 1.5 bits optimum control can be implemented as there are three levels provided, a first level to perform positive reaction, a second level to perform negative reaction and a third level to do nothing. A further advantage is to have a reduced computational complexity as only three signal levels have to be processed.

In a twelfth possible implementation form of the time-to-digital converter according to the first aspect as such or according to any of the preceding implementation forms of the first aspect, the time-to-digital converter comprises a plurality of time quantizers arranged to operate in pipeline.

By having a plurality of time quantizers operating in pipeline the processing time for processing the time quantization can be reduced.

According to a second aspect, the disclosure relates to a high-order time-to-digital converter comprising: an input for receiving a time-domain input signal; a plurality of first-order time-to-digital converters, in particular according to the first aspect as such or according to any of the implementation forms of the first aspect, a first one thereof coupled to the input; a combiner coupled to the plurality of first-order time-to-digital converters for producing a digital output signal; wherein the first one of the first-order time-to-digital converters is producing a time quantization error signal that is fed to the next one of the plurality of first-order time-to-digital converters.

Such a MASH structure (for example MASH 1-1-1 structure or others) can provide third and even higher order noise-shaping and can further improve the resolution and widen the bandwidth. Since the high-order TDC is not based on the delay of inverter or buffer it is very robust and insensitive to PVT variations. The power consumption is relatively low because it can work in low frequency (compared to GRO based TDC).

A high-order TDC may include a high number of TDCs, in particular a number of three and higher. In some implementation forms the high-order TDC may include a number of 100, 200, 500, 1000, 2000, 5000, 10000 or more TDCs. The higher the number of TDCs the better are the noise shaping characteristics of the high-order TDC.

In a first possible implementation form of the high-order time-to-digital converter according to the second aspect, the digital output signal is a digital representation of the time-domain input signal including a noise-shaped quantization error.

This provides the advantage that the digital output signal can very precisely represent the time-domain input signal in a digital representation, for example within a resolution of about 1 ps. Such a resolution is an order-of-magnitude better than that provided by an inverter delay in a conventional process technology. When applying such TDC in low-power mobile applications, such as all-digital PLL (ADPLL)-based cellular phones, accuracy of these devices can be significantly improved.

According to a third aspect, the disclosure relates to a method for time-to-digital conversion, the method comprising: receiving a time-domain input signal; buffering a first signal in a time register, the first signal derived from the time-domain signal and a feedback signal; time-quantizing the buffered first signal for providing a digital output signal; and digital-to-time converting the digital output signal for providing the feedback signal.

By using such feedback structure with time register buffering, time quantizing and feedback signal path, the time-to-digital conversion accuracy can be improved. In particular, a time to digital conversion resolution of about 1-2 ps can be obtained. Such error-feedback based time-todigital conversion utilizes the noise-shaping characteristic to push the quantization noise to high frequency. Thus, the in-band or low frequency noise is largely reduced.

In a first possible implementation form of the method according to the third aspect, the digital output signal is a digital representation of the time-domain input signal.

By using a digital output signal being a digital representation of the time-domain input signal, the accuracy of the noise-shaping can be improved. The noise can be shifted to regions where the noise is not harmful.

In a second possible implementation form of the method according to the third aspect as such or according to the first implementation form of the third aspect, the feedback signal is a quantization error signal.

When the feedback signal is a quantization error signal, the quantization error can be controlled by using an adequate transfer function.

In a third possible implementation form of the method according to the third aspect as such or according to any of the preceding implementation forms of the third aspect, the method comprises delaying an output signal of the time register in response to the digital output signal.

This provides the advantage of having a synchronous operation of the time-to-digital conversion. The operation can be synchronized by using a clock signal.

In a fourth possible implementation form of the method according to the third aspect as such or according to any of the preceding implementation forms of the third aspect, the method comprises combining the time-domain input signal with the feedback signal to produce a modified time-domain input signal.

When the method includes combining the time-domain input signal with the feedback signal a feedback loop can be implemented thereby facilitating noise shaping.

In a fifth possible implementation form of the method according to the fourth implementation form of the third aspect, the method comprises subtracting the feedback signal from the time-domain input signal to produce the modified time-domain input signal.

When the feedback signal is subtracted from the time-domain input signal the quantization error can be minimized thereby performing optimal noise shaping and improved accuracy of the time to digital conversion.

In a sixth possible implementation form of the method according to the fourth or the fifth implementation form of the third aspect, the method comprises delaying the modified time-domain input signal by at least one cycle of a sampling clock.

When the time register delays the modified time-domain input signal by one or more sampling clock cycles a transfer function of the TDC can be realized. Depending on the number of sampling clock cycles and a degree or order of the TDC the transfer function can be shaped with respect to some optimization criterion.

In a seventh possible implementation form of the method according to the third aspect as such or according to any of the preceding implementation forms of the first aspect, the time-domain input signal comprises a pair of two input signals.

When the time-domain input signal comprises a pair of two input signals, these two input signals can be synchronously processed.

In an eighth possible implementation form of the method according to the seventh implementation form of the third aspect, the two input signals comprise a first digital clock and a second digital clock.

When the two input signals are a first digital clock and a second digital clock, the two digital clock signals can be synchronously processed and an output signal can be provided depending on a relation between the two digital clock signals.

In a ninth possible implementation form of the method according to the eighth implementation form of the third aspect, a value of the time-domain input signal corresponds to a time difference between a transition of the first digital clock and a transition of the second digital clock.

When a value of the time-domain input signal corresponds to a time difference between a transition of the first digital clock and a transition of the second digital clock the digital output signal can accurately reproduce the time difference between the two clock transitions in a digital form.

In a tenth possible implementation form of the method according to the third aspect as such or according to any of the preceding implementation forms of the third aspect, the time quantizing produces 1.5 bits.

By having 1 bit two signal levels can be implemented. By having 2 bits four signal levels can be implemented. When the time quantizing produces 1.5 bits, three different signal levels can be provided in a very computational efficient manner.

In an eleventh possible implementation form of the method according to the third aspect as such or according to any of the preceding implementation forms of the third aspect, a resolution of the time quantizing is 1.5 bits.

When the resolution of the time quantizing is 1.5 bits three signal levels can be implemented. By having 1.5 bits optimum control can be implemented as there are three levels provided, a first level to perform positive reaction, a second level to perform negative reaction and a third level to do nothing. A further advantage is to have a reduced computational complexity as only three signal levels have to be processed.

In a twelfth possible implementation form of the method according to the third aspect as such or according to any of the preceding implementation forms of the third aspect, the time quantizing is performed in pipeline.

By performing the time quantizing operating in pipeline the processing time for processing the time quantizing can be significantly reduced.

BRIEF DESCRIPTION OF THE DRAWINGS

Further embodiments of the disclosure will be described with respect to the following figures, in which.

DETAILED DESCRIPTION OF EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
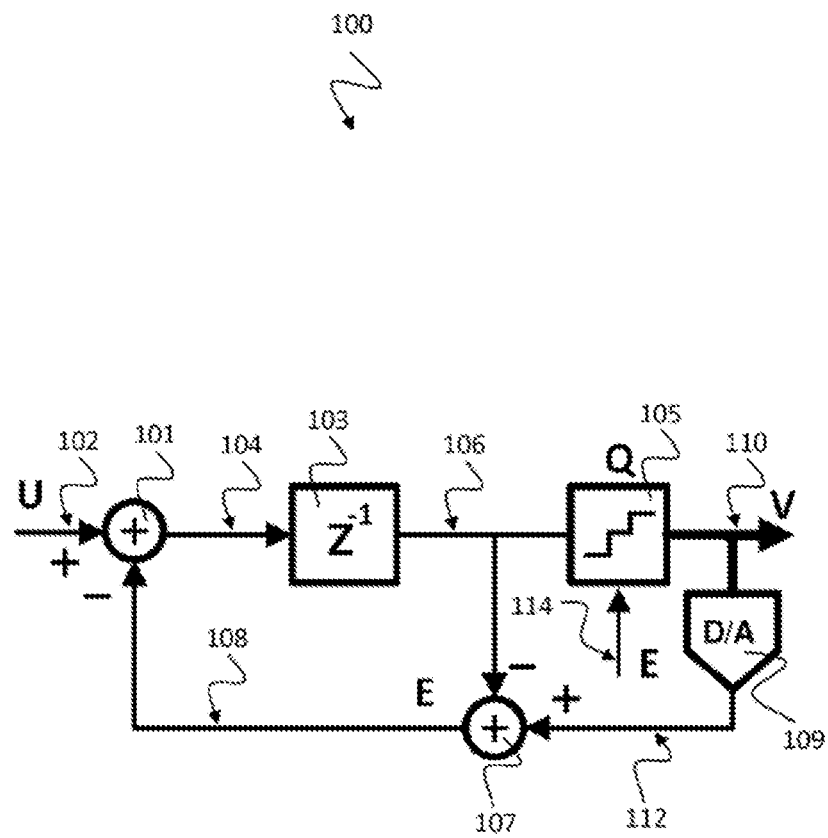
FIG. 1 shows a block diagram illustrating the general error-feedback structure 100 in the z-domain according to an implementation form.

FIG. 1 shows a block diagram illustrating the general error-feedback structure 100 in the z-domain according to an implementation form.

The error-feedback structure 100 includes a first adder 101, a delay unit 103, a quantizer 105, a digital-to-analog converter 109 and a second adder 107. The first adder 101 receives an input signal (U) at a first input 102 and a quantization error (E) at a first node 108 and is configured to subtract the error signal E from the input signal U to provide a first adder output signal 104 that is passed to the delay unit 103. The delay unit 103 delays the first adder output signal 104 by a unit delay to provide a delay unit output signal 106 that is passed to the quantizer 105 and the second adder 107. The quantizer 105 is configured to quantize the delay unit output signal 106 in steps determined by a control signal 114 to provide a digital output signal V at an output 110 of the error-feedback structure 100. The digital output signal V is passed to the digital-to-analog converter 109 to provide an analog output signal 112 that is passed to the second adder 107. The second adder 107 subtracts the delay unit output signal 106 from the analog output signal 112 to provide the quantization error (E) at the first node 118.

The error-feedback structure 100 can achieve the noise-shaping characteristics without using the integrator, which is the inevitable component in $\Delta\Sigma$ modulator. The z-domain model of the structure is shown in FIG. 1. Here, the quantization error E is obtained in analog form by subtracting the internal quantizer's 105 input 106 from the DAC 109 output 112. E is then fed back to the input (at first node 108) and the error between input signal U and E goes through the unit delay 103, $z^{-1}$, whose output 106 is connected to the quantizer 105. The output signal 110 in the z-domain is: $V=z^{-1}U+(1-z^{-1})$, where, V is the digital output and U is the analog input.

The input signal U is not only limited to be an electrical signal, but also can be a manner of temperature, mass and even time. Therefore, the time-domain error-feedback structure 100 can be implemented if the analog form of the z-domain is presented by time-interval as described below with respect to FIG. 2.

Figure 2:
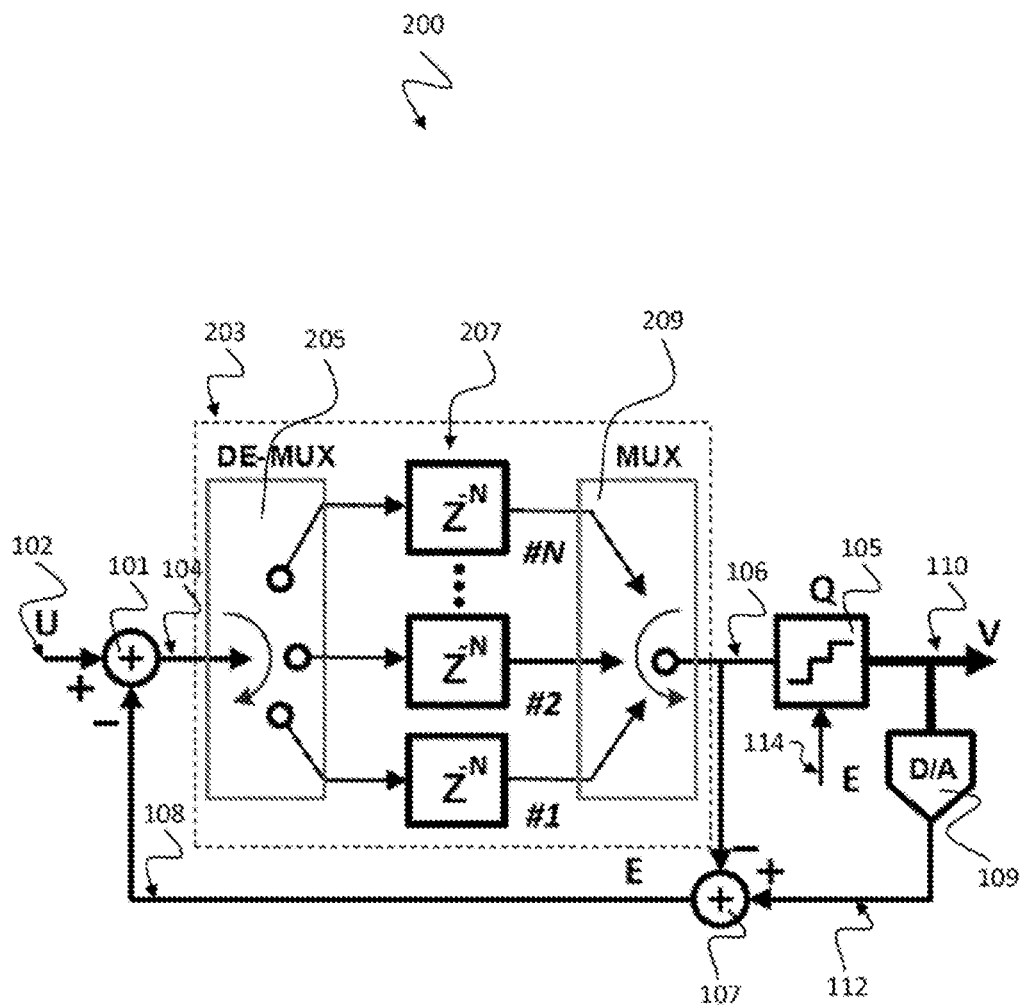
FIG. 2 shows a block diagram illustrating an error-feedback structure 200 in the time-domain according to an implementation form.

FIG. 2 shows a block diagram illustrating an error-feedback structure 200 in the time-domain according to an implementation form. The error-feedback structure 200 corresponds to the error-feedback structure 100 described above with respect to FIG. 1. However, the delay unit 103 is replaced by a multiplexing structure 203 including a demultiplexer 205, a multiplexer 209 and a number of N delay units 207 coupled between the demultiplexer 205 and the multiplexer 209. The first adder output signal 104 is provided to the demultiplexer 205 demultiplexing the first adder output signal 104 into N sub-sampled signals that are respectively delayed by the N delay units 207 and multiplexed by the multiplexer 209 to provide the delay unit output signal 106.

The $\Delta\Sigma$ structure limits the operational bandwidth due to the relatively low conversion rate of the $\Delta\Sigma$ converter. Especially, the ADPLL-targeted TDCs usually operate at a fixed crystal reference clock, of only tens of MHz. In order to achieve high bandwidth with relative low OSR, a time-interleaved time register 203 is introduced in the $\Delta\Sigma$ loop by employing a number of time registers 207 working in parallel. As shown in FIG. 2, the multiplexer 209 sequentially selects the output of each channel to obtain the full-rate output 106 and makes the operation equivalent to a single register sped up by a factor equal to the number N of parallel paths.

Figure 3:
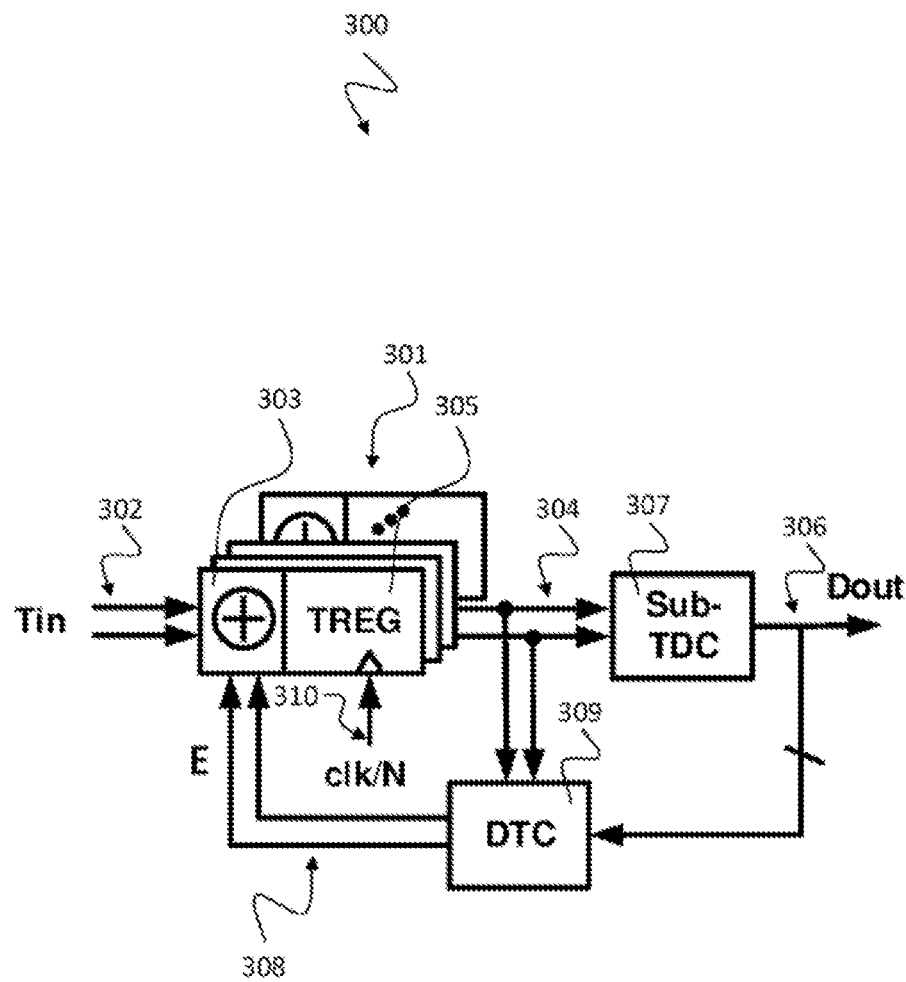
FIG. 3 shows a block diagram illustrating an error-feedback structure 300 with time-interleaved register in the z-domain according to an implementation form.

The implementation of the TDC 300 is shown in FIG. 3 described below. The time-interleaved time register 305 realizes the unit delay functionality $z^{-1}$ in the z-domain model. The time-domain register 305 is combined with an adder/subtractor 303, which is shown as two separated components in FIG. 3.

FIG. 3 shows a block diagram illustrating an error-feedback structure 300 with time-interleaved register in the z-domain according to an implementation form. The time-to-digital converter 300 includes an input 302 for receiving a time-domain input signal Tin; an output 306 for providing a digital output signal Dout; a time register 305 coupled to the input 302 and to a first node 308; a time quantizer 307 coupled to the time register 305 for providing the digital output signal Dout at the output 306; and a digital-to-time converter 309 coupled to the output 306 for providing a feed-back signal E at the first node 308.

The digital output signal Dout is an oversampled representation of the time-domain input signal Tin. The feedback signal E is a quantization error signal $Q_{err}$. The digital-to-time converter 309 is coupled to the time register 305 for delaying an output signal 304 of the time register 305 in response to the digital output signal Dout. The time register 305 combines 303 the time-domain input signal Tin with the feedback signal E to produce a modified time-domain input signal. In FIG. 3, the combination 303 is a subtraction. The time register 305 delays the modified time-domain input signal by at least one cycle of a sampling clock. The time-domain input signal Tin may include a pair of two input signals that may include a first digital clock and a second digital clock. A value of the time-domain input signal Tin may correspond to a time difference between a transition of the first digital clock and a transition of the second digital clock.

The error-feedback structure 300 corresponds to the error-feedback structure 100 described above with respect to FIG. 1. However, the unit delay $z^{-1}$ 103 and the first adder 101 that performs a subtraction operation are replaced by a time-domain register 305 combined with subtractor 303. The voltage quantizer 105 or internal ADC of the error-feedback structure 100 described above with respect to FIG. 1 is replaced by a sub-TDC 307, whose input is the time-difference 304 or time interval instead of the voltage. Similarly, digital-to-time converter (DTC) 309 is used here to convert the digital code to time-interval, which is fed back to the input or first node 308 respectively.

The time-domain register 305 combined with subtractor 303 may be implemented as a plurality of subtractor-register devices 301 as described above with respect to FIG. 2 that may operate in parallel, e.g. by performing a pipeline processing. Such a parallel processing reduces the processing burden on the time-domain register 305. Instead of a single processing task multiple processing tasks can be performed by the multiple subtractor-register devices 301 in the same time instant.

The quantization noise is pushed to the high frequency due to the noise-shaping characteristic thus making the TDC's 300 resolution depend on the device noise, such as flicker/thermal noise instead of quantization noise. Therefore, the resolution of the TDC 300 is highly improved and independent from the process of technology. For example, in 40 nm CMOS process the minimal delay of inverter is about 10 ps.

Figure 4:
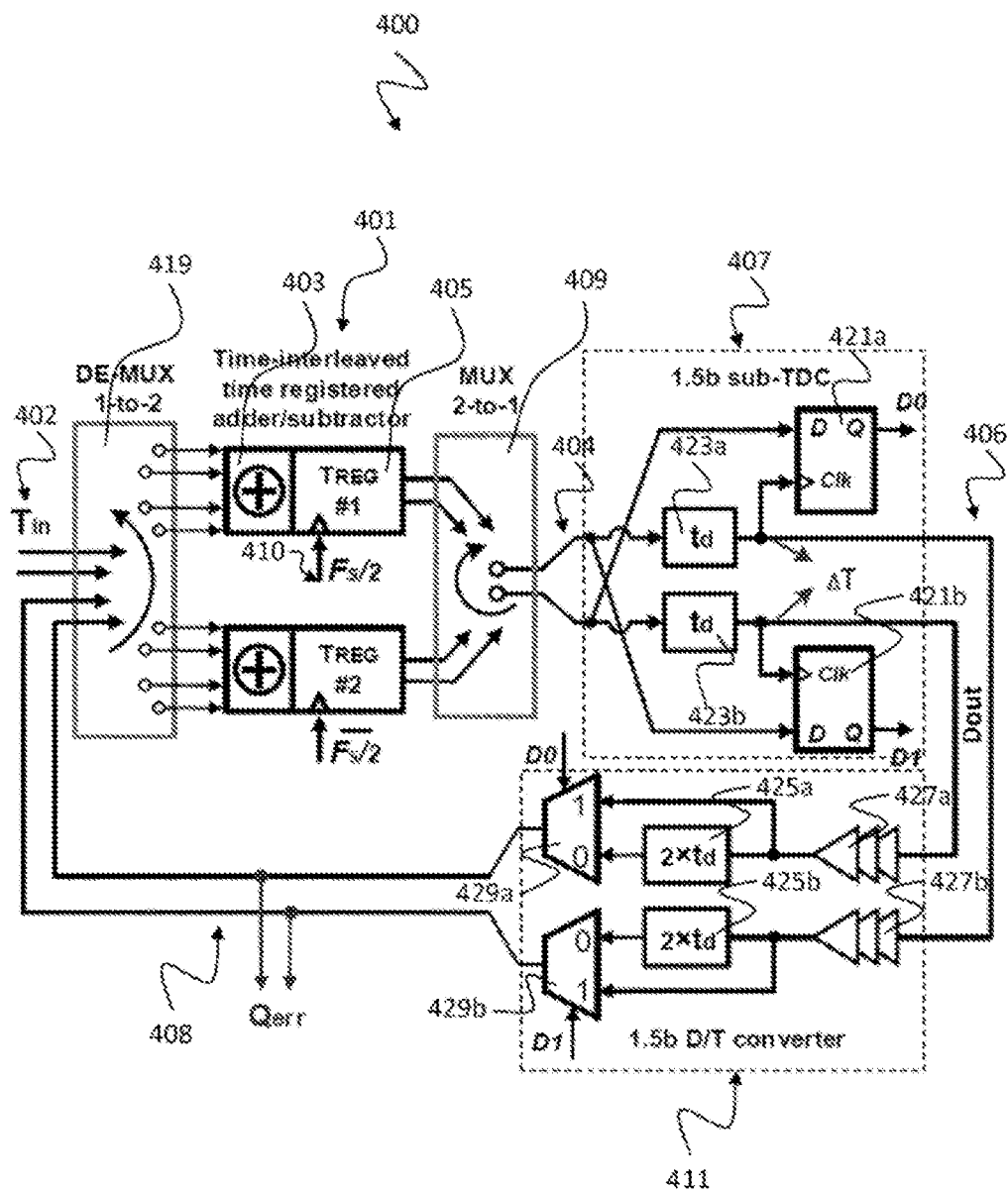
FIG. 4 shows a block diagram illustrating the architecture of ΔΣ TDC 400 with time-interleaved time registered adder/subtractor according to an implementation form.

FIG. 4 shows a block diagram illustrating the architecture of $\Delta\Sigma$ TDC 400 with time-interleaved time registered adder/subtractor according to an implementation form. In particular, the figure shows further details of the 1st order $\Delta\Sigma$ TDC in the error-feedback configuration. It includes a time-interleaved time registered adder/subtractor 403, 405 that may correspond to the device 303, 305 described above with respect to FIG. 3, a 1.5 b sub-TDC 407 and a 1.5 b DTC 411. The time-interleaved time registered adder/subtractor 403, 405 are implemented using two parallel identical units 401 to provide the trade-off between speed and accuracy. The $\Delta\Sigma$ TDC runs at its full speed $F_S$=50 MHz while the de-multiplexer delivers the input samples 402 to the two parallel time registered adders/subtractors 401 whose operation frequency is reduced to $F_S/2$=25 MHz. A 1.5 b sub-TDC 407 with resolution of 2×td (20 ps) is used to obtain one more threshold level (compare to 1 b) associated to the input range. The 1.5 b also applies to the DTC 411 to relax its linearity since its error is injected directly at input of the $\Delta\Sigma$ TDC.

The time-to-digital converter 400 includes an input 402 for receiving a time-domain input signal Tin; an output 406 for providing a digital output signal Dout; a time register 405 coupled to the input 402 and to a first node 408; a time quantizer 407 coupled to the time register 405 for providing the digital output signal Dout at the output 406; and a digital-to-time converter 411 coupled to the output 406 for providing a feed-back signal $Q_{err}$ at the first node 408.

The digital output signal Dout is an oversampled representation of the time-domain input signal Tin. The feedback signal is a quantization error signal $Q_{err}$. The digital-to-time converter 411 is coupled to the time register 405 for delaying an output signal 404 of the time register 405 in response to the digital output signal Dout. The time register 405 combines 403 the time-domain input signal Tin with the feedback signal $Q_{err}$ to produce a modified time-domain input signal. In FIG. 4, the combination 403 is a subtraction, however any other combination may be used as well. The time register 405 delays the modified time-domain input signal by at least one cycle of a sampling clock 410. The time-domain input signal Tin may include a pair of two input signals. The two input signals may include a first digital clock and a second digital clock. A value of the time-domain input signal Tin may correspond to a time difference between a transition of the first digital clock and a transition of the second digital clock. The time quantizer 407 that is implemented as a 1.5 bit TDC may produce 1.5 bits. A resolution of the time quantizer 407 may be 1.5 bits. The time-to-digital converter 400 may include a plurality of time quantizers 407 operating in pipeline.

The error-feedback structure 400 corresponds to the error-feedback structure 300 described above with respect to FIG. 3 in which the plurality of subtractor-register devices 301 are implemented by dual time interleaved time registered adder/subtractor devices 401 operating in multiplex. The multiplex structure 419, 401, 409 includes a demultiplexer 419, a multiplexer 409 and two time interleaved time registered adder/subtractors 403, 405. The two time interleaved time registered adder/subtractors 403, 405 are coupled between the demultiplexer 419 and the multiplexer 409 to perform the time interleaving. The input signal Tin is provided to the demultiplexer 419 demultiplexing the input signal Tin into two sub-sampled signals that are subsequently passed to the two time interleaved time registered adder/subtractors 403, 405 for buffering the two sub-sampled signals in an interleaved manner. The two time interleaved time registered adder/subtractors 403, 405 are sampled by the half sampling frequency $F_S/2$. The multiplexer 409 is used to multiplex the two buffered sub-sampled signals to provide the time-interleaved output signal 404 that is passed to the 1.5 bit TDC 407.

Instead of the described dual time interleaved time registered adder/subtractor devices 401 any number N of parallel time interleaved time registered adder/subtractor devices 401 can be implemented.

The time quantizer 407 that is implemented as a 1.5 bit TDC receives the output signal 404 of the dual time interleaved time registered adder/subtractor devices 401 as a signal pair. The time quantizer 407 includes a pair of flip-flops 421a, 421b and a pair of delay units 423a, 423b for delaying the signal pair 404 received from the multiplexer 409. The first flip-flop 421a provides an output D0 based on the second signal of the signal pair 404 and the first signal of the signal pair 404 delayed by the first delay unit 423a. The second flip-flop 421b provides an output D1 based on the first signal of the signal pair 404 and the second signal of the signal pair 404 delayed by the second delay unit 423b. An output signal pair Dout of the time quantizer 407 is formed by delaying the signal pair 404 with the respective delay unit of the pair of delay units 423a, 423b. The output signal pair Dout is provided at the output 406 of the time quantizer 407 which output 406 is coupled with an input of the digital-to-time converter 411.

The digital-to-time converter 411 includes a pair of tri-state inverters 427a, 427b, a pair of double delay units 425a, 425b and a pair of multiplexers 429a, 429b. Each signal rail of the output signal pair Dout is passed through a respective tri-state inverter 427a, 427b, a respective double delay unit 425a, 425b and a respective multiplexers 429a, 429b to produce a quantization error signal pair Qerr at the first node 408 that is fed-back to the dual time interleaved time registered adder/subtractor devices 401. The pair of multiplexers 429a, 429b is controlled by the signals D0, D1 provided by the 1.5 b sub-TDC 407.

Figure 5:
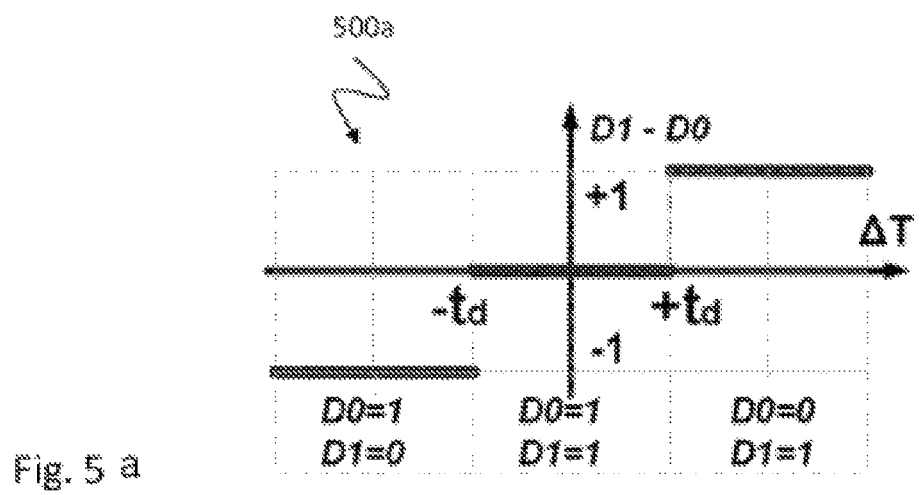
FIG. 5*a* shows a diagram illustrating the transfer function 500*a* of the 1.5 bit sub-TDC 407.
FIG. 5*b* shows a diagram illustrating the transfer function 500*b* of the 1.5 b DTC 411.
Figure 5:
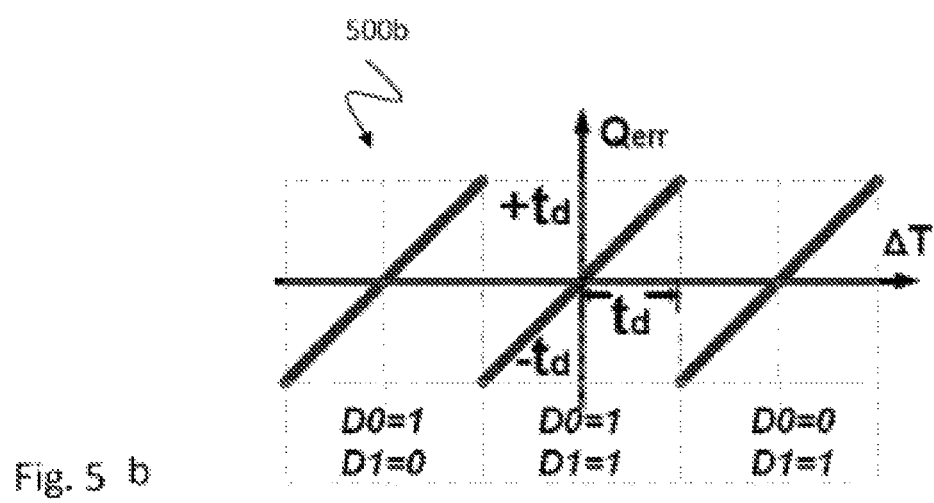

FIG. 5a shows a diagram illustrating the transfer function 500a of the 1.5 bit sub-TDC 407 and FIG. 5b shows a diagram illustrating the transfer function 500b of the 1.5 b DTC 411. The 1.5 bit TDC 407 described above with respect to FIG. 4 includes the pair of flip-flops 421a, 421b which provide the bits D0 and D1 at its outputs. The output signal pair 406 depends on the values of D0 and D1. For D0=1 and D1=1 a time value $-t_d <= \Delta T <= t_d$ is provided at the output of the 1.5 bit TDC 407; for D0=0 and D1=1 a time value $\Delta T > t_d$ is provided; and for D0=1 and D1=0 a time value $\Delta T < t_d$ is provided. $t_d$ corresponds to the time delay of the pair of delay units 423a, 423b as described above with respect to FIG. 4.

By having 1 bit two signal levels can be implemented. By having 2 bits four signal levels can be implemented. Three signal levels as shown in FIG. 5a can be implemented by 1.5 bits, i.e. by the three bit combinations D0=1, D1=1; D0=0, D1=1 and D0=1, D1=0. By having 1.5 bits optimum control can be implemented as there are three levels provided, a first level (D0=0, D1=1) to perform positive reaction, a second level (D0=1, D1=0) to perform negative reaction and a third level (D0=1, D1=1) to do nothing.

The 1.5 bit DTC 411 described above with respect to FIG. 4 includes the pair of multiplexers 429a, 429b that are controlled by the bits D0 and D1. The quantization error $Q_{err}$ at the output of the 1.5 b DTC 411 depends on the values of D0 and D1. For D0=0 and D1=1 the quantization error $Q_{err}$ can be controlled within a first range larger than td; for D0=1 and D1=0 the quantization error $Q_{err}$ can be controlled within a second range smaller than $-t_d$ and for D0=1 and D1=1 the quantization error $Q_{err}$ can be controlled within a third range between $-t_d$ and $t_d$. In all three ranges the quantization error $Q_{err}$ can be controlled with respect to a monotonically increasing line. $t_d$ corresponds to the time delay of the pair of delay units 423a, 423b as described above with respect to FIG. 4.

As described above with respect to FIG. 5a, the three signal levels as shown in FIG. 5b can be implemented by 1.5 bits, i.e. by the three bit combinations D0=1, D1=1; D0=0, D1=1 and D0=1, D1=0. By having 1.5 bits optimum control can be implemented as there are three levels provided, a first level (D0=0, D1=1) to control the quantization error Qerr within a first interval around zero delay extending to positive delays, a second level (D0=1, D1=0) to control the quantization error Qerr within a second interval around zero delay extending to negative delays and a third level (D0=1, D1=1) to control the quantization error Qerr within a third interval around zero delay.

Figures 6A, 6B:
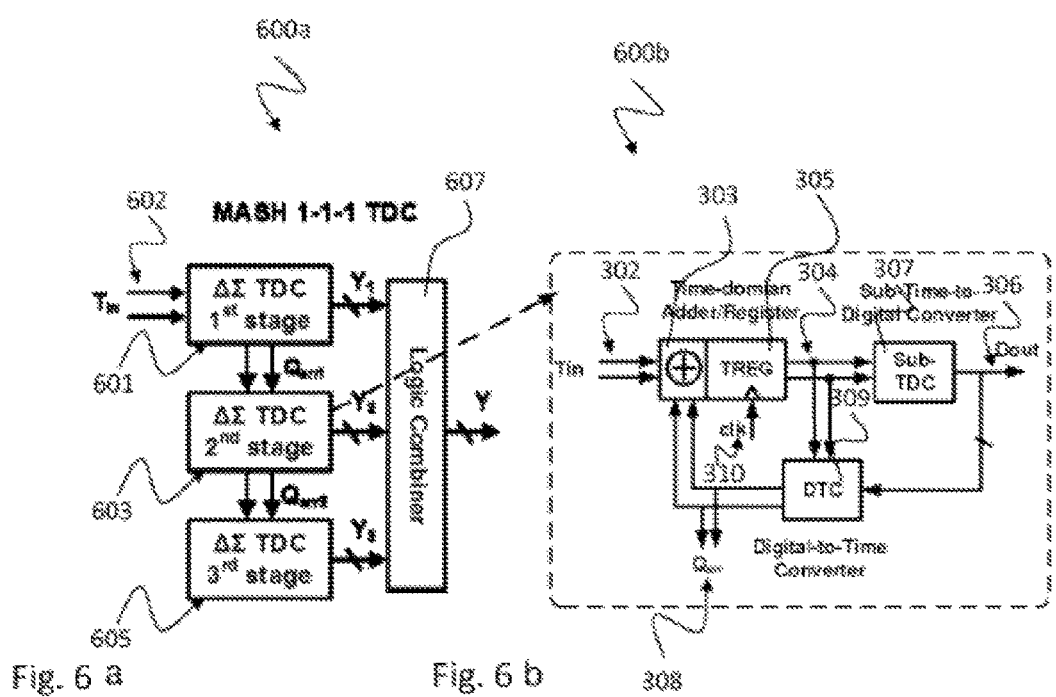
FIG. 6*a* shows a block diagram illustrating a high-order TDC 600*a* in a MASH 1-1-1 structure according to an implementation form.
FIG. 6*b* shows an implementation example of one of the first-order time-to-digital converter stages 601 of the TDC 600*a* depicted in FIG. 6*a*.

FIG. 6a shows a block diagram illustrating a high-order TDC 600a in a MASH 1-1-1 structure according to an implementation form. FIG. 6b shows an implementation example of one of the first-order time-to-digital converter stages 601, 603, 605 of the TDC 600a depicted in FIG. 6a.

The high-order time-to-digital converter 600a includes an input 602 for receiving a time-domain input signal Tin, a plurality of first-order time-to-digital converter stages 601, 603, 605, e.g. TDCs 600b as described above with respect to FIG. 3 or 4, and a combiner 607. A first one 601 of the first-order time-to-digital converter stages is coupled to the input 602. The combiner 607 is coupled to outputs of the plurality of first-order time-to-digital converters 601, 603, 605 for producing a digital output signal Y by combining the output signals Y1, Y2, Y3 of the first-order time-to-digital converters 601, 603, 605. The first one 601 of the first-order time-to-digital converters 601, 603, 605 is producing a first time quantization error signal $Q_{err1}$ that is fed to the next one 603 of the plurality of first-order time-to-digital converters 601, 603, 605. The second one 603 of the first-order time-to-digital converters 601, 603, 605 is producing a second time quantization error signal $Q_{err2}$ that is fed to the next one 605, i.e. the third one 605 of the plurality of first-order time-to-digital converters 601, 603, 605.

The digital output signal Y is a digital representation of the time-domain input signal Tin including a noise-shaped quantization error.

The core of the TDC 600a is based on the error-feedback structure 600b that is then replicated to increase the noise shaping order to 3rd, which consists of a time interleaved time-domain adder/subtractor register, quantizer and digital-to-time converter (DTC). With all above, the time-domain noise-shaping characteristic is realized. As shown in FIG. 6, the error feedback TDC described above with respect to FIGS. 3 and 4 can be cascaded to form the MASH 1-1-1 structure, which can provide $3^{rd}$ order noise-shaping and further improve the TDC resolution and broaden the bandwidth.

The error-feedback based TDC 600b as shown in FIG. 6b utilizes the noise-shaping characteristic to push the quantization noise to high frequency. Thus, the in-band or low frequency noise is largely reduced. The new error feedback structure can be cascaded into MASH 1-1-1 structure 600a as shown in FIG. 6a, which can provide third (even higher) order noise-shaping and further improve the resolution and widen the bandwidth. Since it is not based on the delay of inverter or buffer it is very robust and unsensitive to PVT variations. The power consumption is relatively low because it can work in low frequency (comparing to GRO based TDC).

The ΔΣ TDC in the 1st-order error-feedback manner can be cascaded as MASH 1-1-1 configuration to realize the $3^{rd}$ order noise-shaping without any stability concerns. Contrary to prior art, the MASH ΔΣ TDCs can be easily constructed here by feeding the quantization error Qerr of the preceding stage to the next. The basic idea of a cascade architecture is similar to a pipeline scheme where every stage, in addition to the digital result, generates the residual to be processed by a subsequent stage. The MASH does the same with a ΔΣ modulator in the cells that, further to the digital output, provide the quantization noise as the input to the following stage, as shown in FIG. 6. A suitable digital processing enables canceling the quantization noise of all but the one of the last stage giving rise to an output noise equal to the spectrum of the last quantization noise shaped by an order equal to the addition of all the orders. As a result, the output signal is expressed as: $Y = z^{-3}T_{in} + (1-z^{-1})^3 Q_{err3}$. The term $z^{-3}T_{in}$ is generated by the logic combiner 607 which is shown in FIG. 6. In other words, each stage of Delta-Sigma TDC will contribute a delay $z^{-1}$. Therefore, three stages of Delta-Sigma TDC will contribute three delays, that is, $z^{-3}$.

Figure 7:
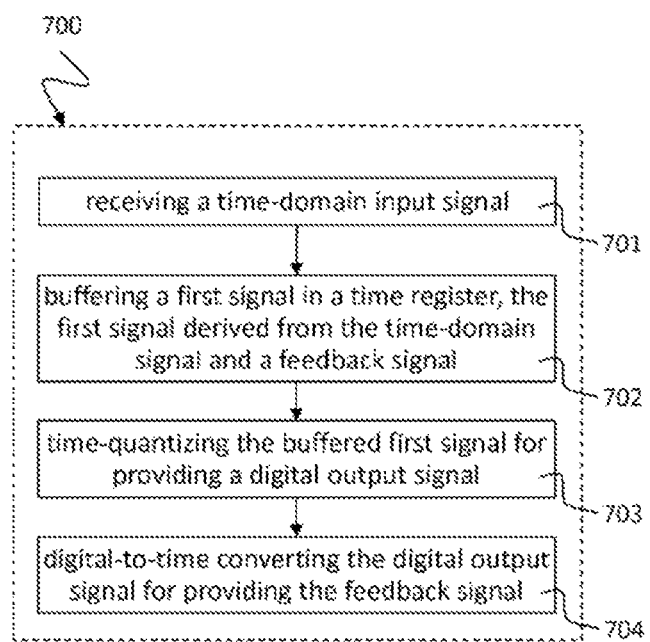
FIG. 7 shows a schematic diagram illustrating a method 700 for time-to-digital conversion according to an implementation form.

FIG. 7 shows a schematic diagram illustrating a method 700 for time-to-digital conversion according to an implementation form.

The method 700 includes receiving 701 a time-domain input signal; buffering 702 a first signal in a time register, the first signal derived from the time-domain signal and a feedback signal; time-quantizing 703 the buffered first signal for providing a digital output signal; and digital-to-time converting 704 the digital output signal for providing the feedback signal.

The digital output signal may be a digital representation of the time-domain input signal. The feedback signal may be a quantization error signal. The method may further include delaying an output signal of the time register in response to the digital output signal. The method may further include combining the time-domain input signal with the feedback signal to produce a modified time-domain input signal. The method may further include subtracting the feedback signal from the time-domain input signal to produce the modified time-domain input signal. The method may further include delaying the modified time-domain input signal by at least one cycle of a sampling clock. The time-domain input signal may include a pair of two input signals. The two input signals may include a first digital clock and a second digital clock.

A value of the time-domain input signal may correspond to a time difference between a transition of the first digital clock and a transition of the second digital clock. The time quantizing may produce 1.5 bits. A resolution of the time quantizing may be 1.5 bits. The time quantizing may be performed in a pipelined manner.

The method 700 may implement the same functionality as the devices described above with respect to FIGS. 1-4 and 6. In particular the method 700 may be used for realizing the transfer function 500a of the 1.5 bit sub-TDC 407 depicted in FIG. 5a and the transfer function 500b of the 1.5 b DTC 411 depicted in FIG. 5b.

TDCs as presented above have noise-shaping, in particular high-order noise shaping characteristics that may be detected by probing the RF output in a CW mode. The TDCs may have a regular sigma-delta structure. TDCs as presented above can be used in PLLs. When such a TDC is used in a PLL, the noise shaping in spectrum may effect a widening of the bandwidth of the PLL.

The present disclosure also supports a computer program product including computer executable code or computer executable instructions that, when executed, causes at least one computer to execute the performing and computing steps described herein, in particular the method 700 as described above with respect to FIG. 7 and the techniques described above with respect to FIGS. 1 to 6. Such a computer program product may include a readable storage medium storing program code thereon for use by a computer. The program code may perform the method 900 as described above with respect to FIG. 7.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as specifically described herein.

What is claimed is:

1. A cascaded time-to-digital converter (TDC) comprising:
   a first first-order TDC for receiving a input signal, wherein the first first-order TDC is a first-order TDC of a plurality of first-order TDCs;
   a second first-order TDC configured to receive as input a first time quantization error produced by the first first-order TDC, wherein the second first-order TDC is a first-order TDC of the plurality of first-order TDCs; and
   a combiner circuit coupled to an output of the first first-order TDC and an output of the second first-order TDC, wherein the combiner circuit is configured to produce a digital output signal by combining the output of the first first-order TDC and the output of the second first-order TDC.

2. The cascaded time-to-digital converter of claim 1, wherein the second first-order TDC is configured to produce a second time quantization error, wherein the second time quantization error is fed to another one of the plurality of first-order TDCs other than the first first-order TDC to form a MASH 1-1-1 structure.

3. The cascaded time-to-digital converter of claim 1, wherein each first-order TDC in the plurality of first-order TDCs includes:
   an output coupled to the combiner circuit;
   a time register coupled a first node;
   a time quantizer coupled to the time register for providing a digital output signal at the output; and
   a digital-to-time converter coupled to the output for providing a feedback signal at the first node.

4. The cascaded time-to-digital converter of claim 3, wherein each first-order TDC in the plurality of first-order TDCs further includes:
   an input, wherein the time register is further coupled to the input.

5. The cascaded time-to-digital converter of claim 3, wherein the first quantization error signal is input at a first node of the first first-order TDC as a feedback signal.

6. The cascaded time-to-digital converter of claim 3, wherein the digital-to-time converter of the first first-order TDC is coupled to the time register for delaying an output signal of the time register in response to the digital output signal.

7. The cascaded time-to-digital converter of claim 1, wherein the first first-order TDC is further configured to combine the input signal with the first quantization error signal to produce a modified time-domain input signal.

8. The cascaded time-to-digital converter of claim 7, wherein a time register of the first first-order TDC is configured to delay the modified time-domain input signal by at least one cycle of a sampling clock.

9. The cascaded time-to-digital converter of claim 7, wherein the digital output signal is a digital representation of the time-domain input signal including a noise-shaped quantization error.

10. The cascaded time-to-digital converter of claim 1, wherein the input signal comprises a first digital clock and a second digital clock.

11. The cascaded time-to-digital converter of claim 10, wherein a value of the input signal corresponds to a time difference between a transition of the first digital clock and a transition of the second digital clock.

12. A cascaded time-to-digital converter comprising:
a first node coupled to an input line for receiving an input signal;
an output for providing a digital output signal;
a time register coupled the first node; and
a digital-to-time converter coupled to the output for providing a feedback signal at the first node, wherein the digital-to-time converter is further coupled to the time register for delaying an output signal of the time register in response to the digital output signal.

13. The time-to-digital converter of claim 12, wherein the feedback signal is a quantization error signal.

14. The time-to-digital converter of claim 12, wherein the time register is further configured to combine the input signal with the quantization error signal to produce a modified time-domain input signal.

15. The time-to-digital converter of claim 14, wherein the time register is configured to delay the modified time-domain input signal by at least one cycle of a sampling clock.

16. The time-to-digital converter of claim 12, wherein the input signal comprises a first digital clock and a second digital clock.

17. The cascaded time-to-digital converter of claim 16, wherein a value of the input signal corresponds to a time difference between a transition of the first digital clock and a transition of the second digital clock.

18. A method for time-to-digital conversion of an input signal, the method comprising:
receiving a time-domain input signal;
buffering, in a time register, a first signal derived from the time-domain input signal and a feedback signal;
time-quantizing the first signal for providing a digital output signal; and
digital-to-time converting the digital output signal for providing the feedback signal; and
delaying an output signal of the time register in response to the digital output signal.

19. The method according to claim 18, further comprising:
combining the input signal with the feedback signal to produce a modified time-domain input signal.

20. The method according to claim 18, further comprising:
delaying the modified time-domain input signal by at least one cycle of a sampling clock.

* * * * *